United States Patent
Chang et al.

(10) Patent No.: US 7,390,754 B2
(45) Date of Patent: Jun. 24, 2008

(54) METHOD OF FORMING A SILICIDE

(75) Inventors: Chun-Chieh Chang, Tainan County (TW); Tzung-Yu Hung, Tainan Hsien (TW); Chao-Ching Hsieh, Hsin-Chu Hsien (TW); Yi-Wei Chen, Tai-Chung Hsien (TW); Yu-Lan Chang, Kao-Hsiung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/458,690

(22) Filed: Jul. 20, 2006

(65) Prior Publication Data

US 2008/0020587 A1 Jan. 24, 2008

(51) Int. Cl.
*H01L 21/302* (2006.01)
*H01L 21/461* (2006.01)

(52) U.S. Cl. .................. 438/745; 438/750; 438/754; 438/755

(58) Field of Classification Search .......... 438/689, 438/745, 750, 754, 755
See application file for complete search history.

(56) References Cited

U.S. PATENT DOCUMENTS 5,427,962 A * 6/1995 Sasaki et al. ............. 438/159
2002/0031915 A1 * 3/2002 Ito ............................ 438/721
2004/0259328 A1 * 12/2004 Ito et al. ..................... 438/459
2006/0266737 A1 * 11/2006 Hanestad et al. ............ 216/96
2006/0284264 A1 * 12/2006 Taguwa ...................... 257/384
2007/0010093 A1 * 1/2007 Wang et al. ................ 438/655

FOREIGN PATENT DOCUMENTS

JP     2001068369    * 3/2001

OTHER PUBLICATIONS

Fukuda et al. (J. Electrochem. Soc. Abstract, 2000, vol. 147, No. 10).*
Hydrogen Peroxide Material Data Sheet (1998, see last page) (7 pages).*

* cited by examiner

*Primary Examiner*—Duy-Vu Deo
*Assistant Examiner*—Mahmoud Dahimene
(74) *Attorney, Agent, or Firm*—Winston Hsu

(57) ABSTRACT

A method of stripping a remnant metal is disclosed. The remnant metal is formed on a transitional silicide of a silicon substrate. Firstly, a surface oxidation process is performed on the transitional silicide, so as to form a protective layer on the transitional silicide. Then, a HPM stripping process is performed on the silicon substrate in order to strip the remnant metal.

15 Claims, 7 Drawing Sheets

METHOD OF FORMING A SILICIDE

BACKGROUND OF THE INVENTION

1. Field of the Invention

The present invention relates to a method of stripping a remnant metal, and more particularly, to a method that produces a protective layer on a transitional silicide and performs a stripping process to strip a remnant metal on the transitional silicide.

2. Description of the Prior Art

Transistors are important electrical components utilized in the manufacture of integrated circuits. As semiconductors become smaller and smaller, the manufacture of transistors has undergone great improvement in order to produce transistors of small size and high quality.

In current transistor manufacturing, manufacture of silicide is a method of improving transistor quality. The common method of manufacturing silicide involves self-aligned silicide. The method includes covering a metal layer (e.g. nickel, Ni) on the source/drain and the gate after the source/drain has been manufactured. A titanium nitride (TiN) layer is sputtered on the metal layer. Next, a rapid thermal process (RTP) is performed, and the metal in the metal layer reacts with the silicon in the gate and the source/drain to form transitional silicide on the surfaces of the gate and the source/drain. Afterward, the un-reacted metal layer is removed, and another RTP is processed to transform the transitional silicide on the surfaces of the gate and the source/drain to silicide having lower resistance.

In general, the advantage of forming silicide on the surfaces of the gate and the source/drain is that the Ohmic contact between the gate, the source/drain and the contact plugs is improved. The materials of the contact plugs are conductive metal, such as tungsten (W). The polycrystalline silicon or monocrystalline silicon of the gate and the source/drain have a bad electrical conduction with the contact plugs. Therefore, the silicide is formed on the gate and the source/drain to improve the Ohmic contact between the gate, the source/drain and the conduct plugs, and to enable the sheet resistances of the source/drain to decrease at the same time.

To prevent the silicide (e.g. nickel silicide, NiSi) from agglomerating, the metal layer, which is utilized to form the silicide, includes a low concentration stable metal. The agglomeration in the silicide increases the contact resistance of the contact plug so junction leakage occurs. Therefore, thermally stable metal is added in the metal layer to prevent the agglomeration. For example, 3-8 wt % of platinum (Pt) is added in the Ni metal layer, which is utilized to form the silicide. Because Pt has a stable chemical property, Pt improves the thermal stability of NiSi. So, the NiSi will not agglomerate at a higher temperature after Pt is added.

The strip selectivity between Pt and NiSi is small. When the stripping process is performed to strip the un-reacted Pt, the formed NiSi is stripped at the same time.

Please refer to FIGS. 1-2. FIGS. 1-2 are schematic diagrams of manufacturing the silicide in the prior art. As FIG. 1 shows, a semiconductor wafer 10 has a substrate 12 (e.g. a silicon substrate). A gate 20 is formed on the substrate 12, and the gate 20 includes a gate insulating layer 14 and a gate conductive layer 16. Next, an ion implantation, which decreases the thermal budget, is performed, and source/drain extensions 26 (also called lightly doped drains, LDD) are formed in the substrate 12 of the two lateral sides of the gate 20. Next, a spacer 18 is formed around the gate 20. The gate 20 and the spacer 18 are utilized as masks and an ion implantation is processed to form the source/drain 28 in the substrate 12.

Next, a thin film deposition process is performed, and a metal layer 22 is uniformly formed on the substrate 12 and the gate 22. The metal layer 22 includes 3-8 wt % of Pt and 92-97% Ni. Then, a TiN layer 24 is sputtered on the metal layer 22.

As FIG. 2 shows, a first RTP is performed, and the partial metal layer 22 reacts with the gate conductive layer 16 under the metal layer 22, and the silicon in the source/drain 28 to form a transitional silicide 30. The reaction of the first RTP is:

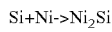

Next, a sulfuric acid-hydrogen peroxide mixture (SPM) striping process is performed, and the TiN layer 24 and the un-reacted Ni in the metal layer 22 are removed. A hydrochloric acid hydrogen peroxide mixture (HPM) is utilized, which reacts with un-reacted Pt above the transitional silicide 30 to generate the complex ions, thereby stripping the un-reacted Pt.

The HPM includes hydrogen peroxide, hydrochloric acid, and chlorine ($Cl_2$). These materials damage the transitional silicide 30; for example, $Cl_2$ is a highly reactive gas, and reacts with metal. As well as reacting with Pt, $Cl_2$ also reacts with the transitional silicide. The transitional silicide is etched and is stripped. The second RTP is performed, and the transitional silicide 30 becomes silicide having a lower resistance. The reaction of the second RTP is:

Please refer to FIG. 3. FIG. 3 is a scanning electron microscopy (SEM) diagram of the un-reacted Pt on the transitional silicide of FIG. 2. As FIG. 3 shows, the substrate 12 has a plurality of transitional silicide 30. The un-reacted Pt 32 lies above the partial transitional silicide 30. Please refer to FIG. 4. FIG. 4 is a SEM diagram of the un-reacted Pt FIG. 2 after the HPM stripping process. As FIG. 4 shows, the HPM striping process can strip the un-reacted Pt, and the transitional silicide 30 on the substrate 12 reacts with $Cl_2$ of HPM. The partial transitional silicide 30 is etched and is stripped to form the damaged region 42.

SUMMARY OF THE INVENTION

The present invention provides a method of stripping a remnant metal, and specifically strips the remnant metal on the transitional silicide. The present invention will not damage the transitional silicide.

One embodiment of the present invention provides a method of stripping remnant metal. The remnant metal is on the transitional silicide of the silicon substrate. The present invention performs a surface oxidation process utilizing hydrogen peroxide on the transitional silicide to form a protective layer on the transitional silicide. Then, a hydrochloric acid hydrogen peroxide mixture (HPM) stripping process is performed on the substrate to strip the remnant metal.

Another embodiment of the present invention provides a method of stripping remnant metal. The remnant metal is on the transitional silicide of the silicon substrate. The present invention performs a surface oxidation process utilizing hydrogen peroxide on the transitional silicide to form a protective layer on the transitional silicide. Then, a stripping process on the substrate is performed to strip the remnant metal on the transitional silicide.

The present invention performs a surface oxidation process to form the oxidation protective layer on the transitional silicide before the stripping process is performed, so the transitional silicide will not be damaged by the stripping process. Furthermore, the surface oxidation process and the stripping process are performed circularly to the transitional silicide. The unnecessary remnants on the transitional silicide, e.g. organic particles or thermally stable metal, are stripped by the stripping process. The formed transitional silicide will not be damaged by the stripping process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
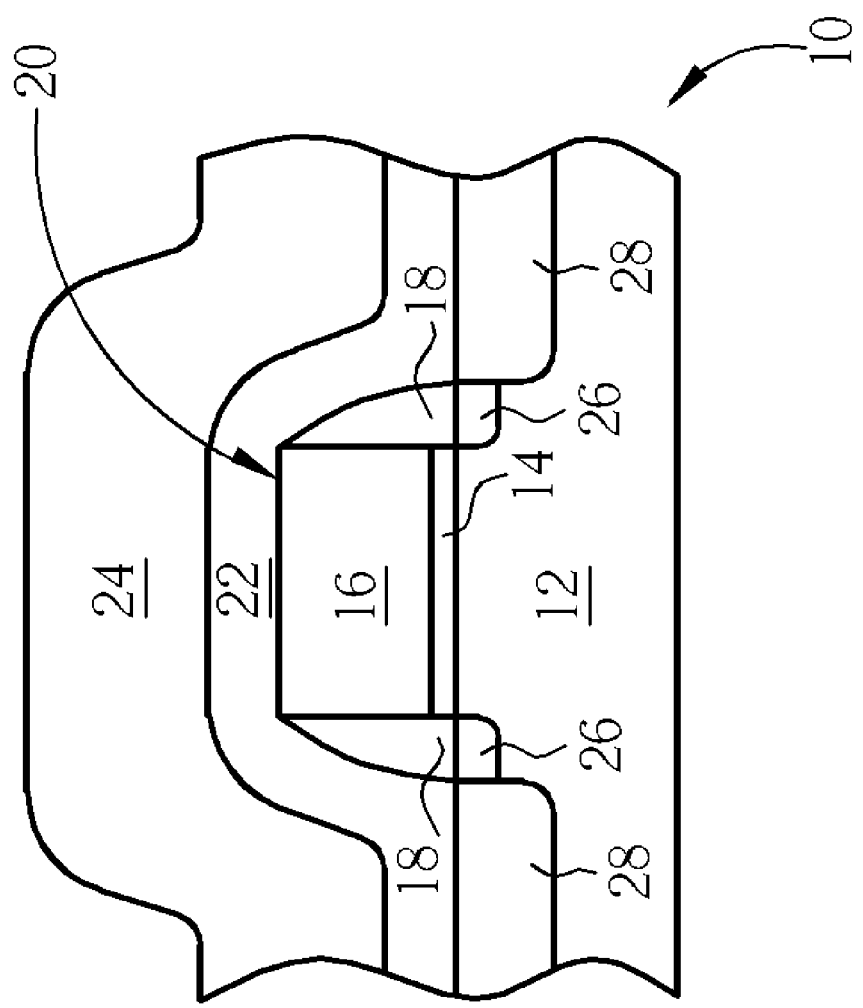
FIGS. 1-2 are schematic diagrams of manufacturing the silicide in the prior art.
Figure 2:
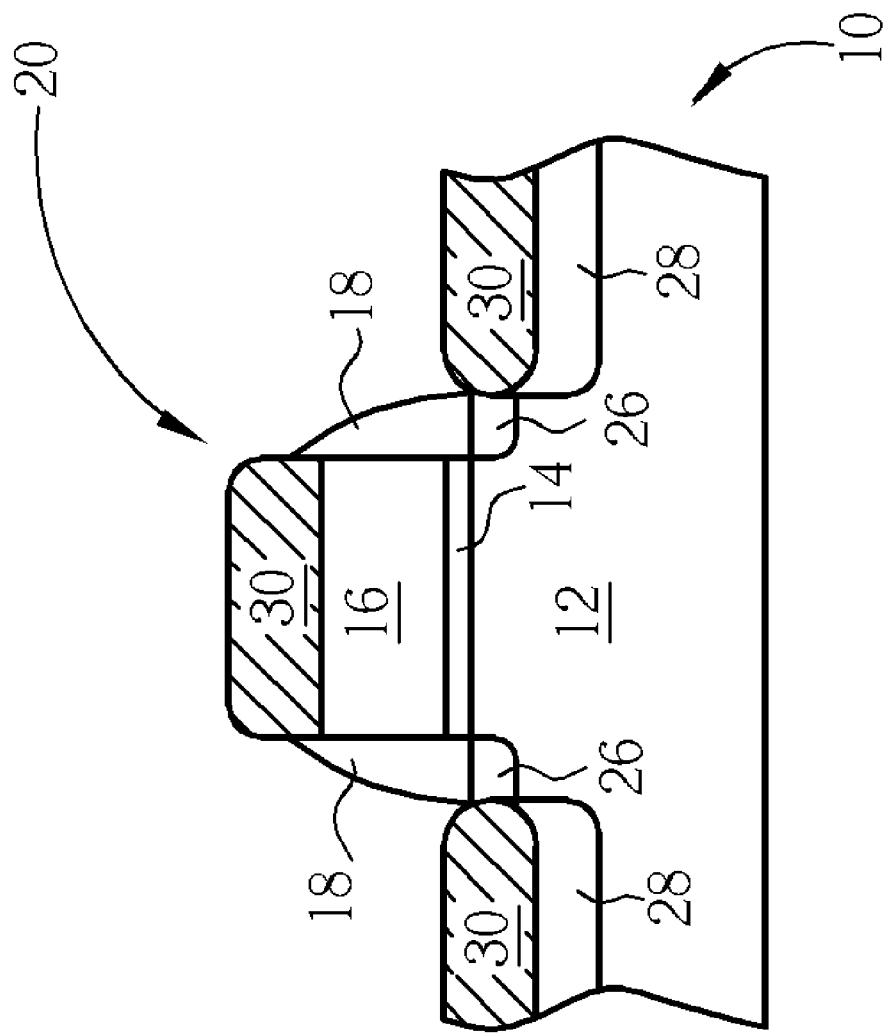
Figure 3:
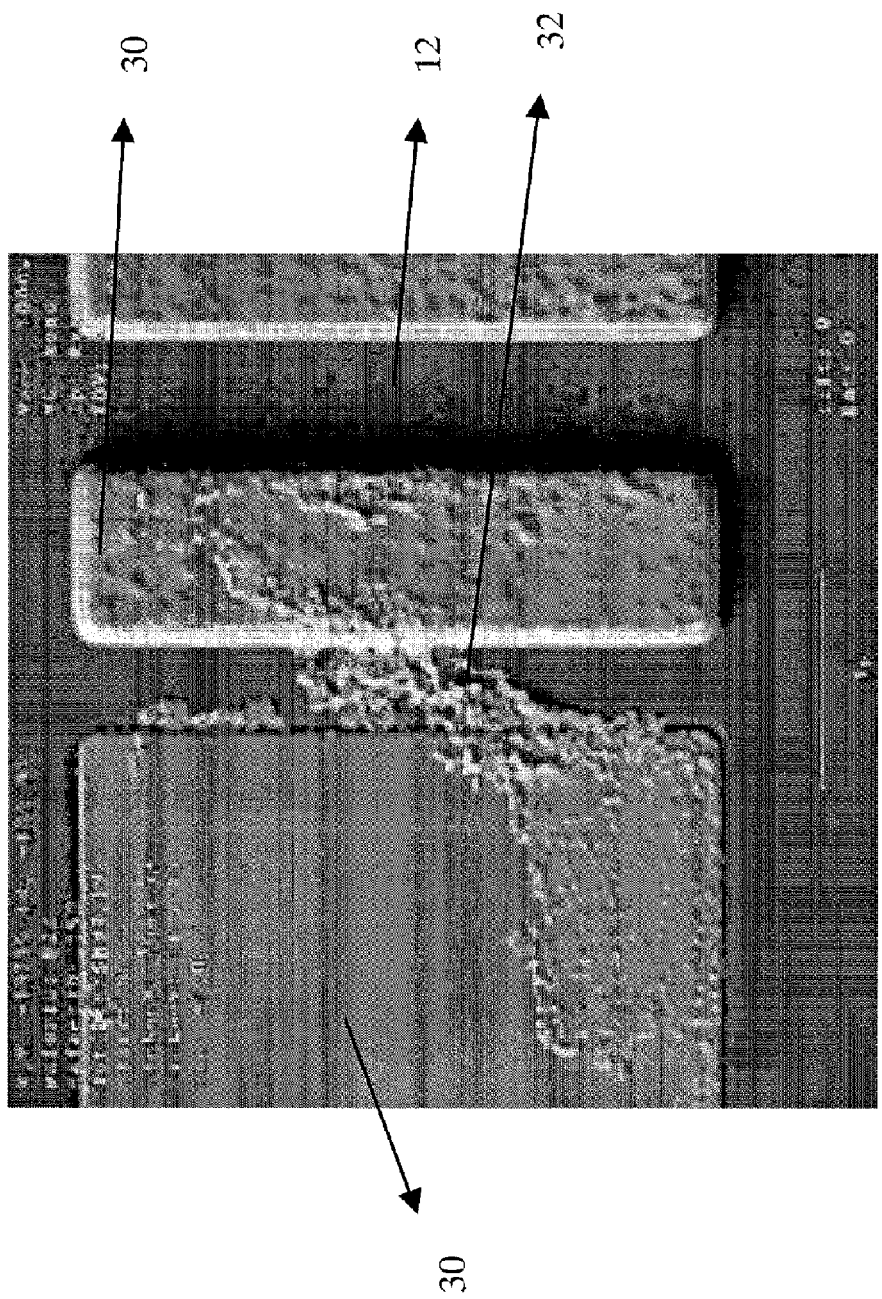
FIG. 3 is a scanning electron microscopy (SEM) diagram of the un-reacted Pt on the transitional silicide of FIG. 2.
Figure 4:
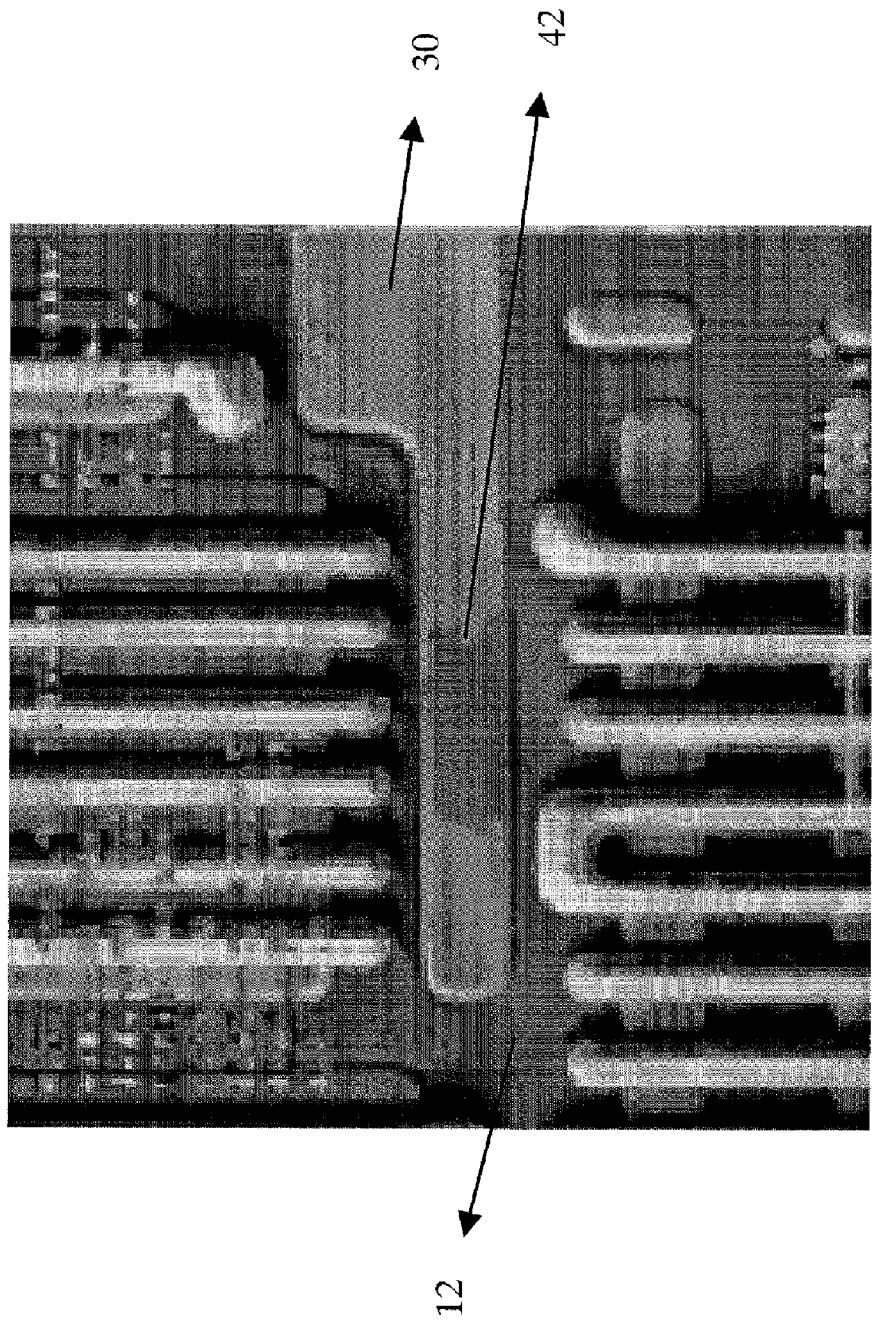
FIG. 4 is an SEM diagram of the un-reacted Pt FIG. 2 after the HPM stripping process.
Figure 5:
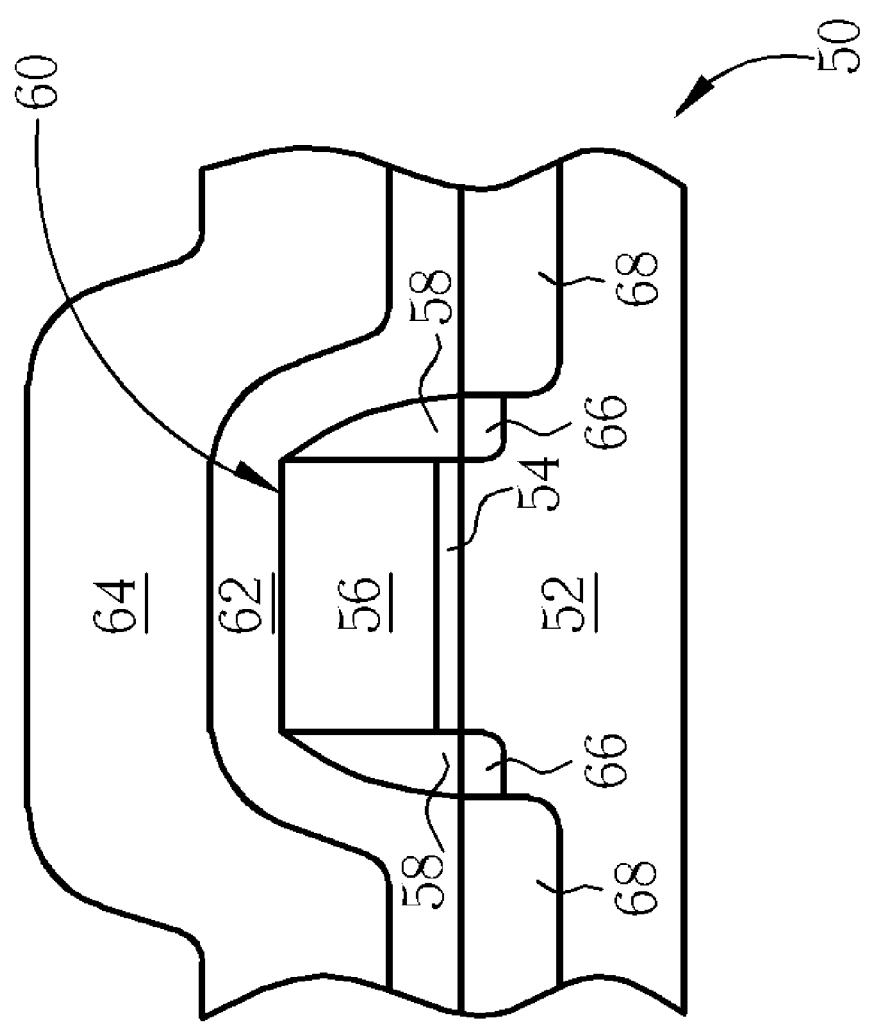
FIGS. 5-6 are schematic diagrams of stripping remnant metal on the transitional silicide according to the embodiment of the present invention.
Figure 6:
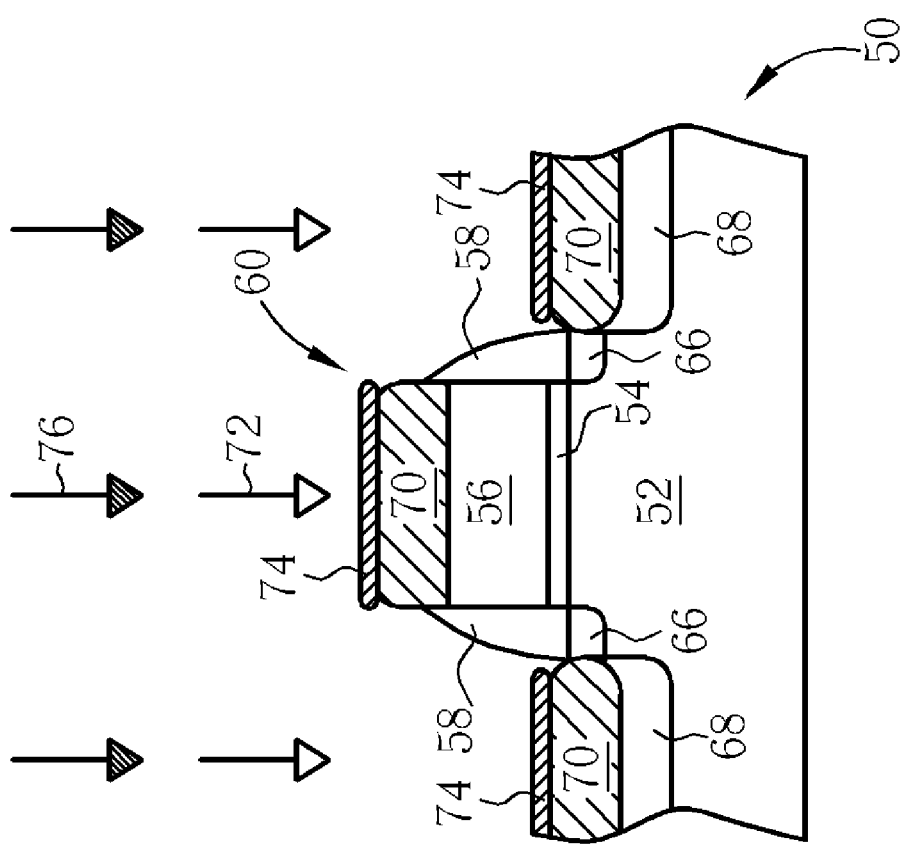

Please refer to FIGS. 5-6. FIGS. 5-6 are schematic diagrams of stripping remnant metal on the transitional silicide according to the embodiment of the present invention. As FIG. 5 shows, a semiconductor wafer 50 has a substrate 52. In this embodiment, the substrate 52 is a silicon substrate. A gate 60 is formed on the substrate 52. The gate 60 includes a gate insulating layer 54 and a gate conductive layer 56. The gate insulating layer 54 is made by a nitric oxide layer, a nitride layer, an oxide layer or another dielectric layer. The gate conductive layer 56 is made from conductive stacks, such as doped polycrystalline silicon or a metal layer.

After the gate 60 is formed, the ion implantation, which can decrease thermal budget, is performed, and source/drain extensions 66 (also called LDD) are formed in the substrate 52 of the two lateral sides of the gate 60. Next, a dielectric layer (not shown) is formed on the gate 60 and the substrate 52. An anisotropic etching process is performed on the dielectric layer to form a spacer 58 around the gate 60. Subsequently, the gate 60 and the spacer 58 are masks and an ion implantation is performed to form a source/drain 68 in the substrate 52 of the two lateral sides of the gate 60.

Next, a film deposition, such as sputter is performed, and a metal layer 62 is uniformly formed on the substrate 52 and the gate 60. The metal layer 62 includes at least two metal materials. One is a main metal, and the main composition of the transitional silicide, which is formed afterward. The other metal material is a metal having stable chemical properties, wherein the reason for inclusion of this metal is to add to the thermal stability of the transitional silicide. In this embodiment, the main metal of the metal layer 62 is Ni, and the metal having stable chemical properties is Pt. Ni is 92-97 wt % of the metal layer 60, and Pt is 3-8 wt %. Then, a TiN layer 64 is sputtered on the metal layer 62. Of course, in the modifications of the present invention, the main metal not only can be formed from Ni, but also from Co or Ti etc.; in other words, any metal that has stable chemical properties can be selected for increasing thermal stability, such as palladium (Pd), manganese (Mn), tantalum (Ta) or ruthenium (Ru).

Next, as FIG. 6 shows, a first RTP is performed, and the partial metal layer 62, the gate conductive layer 56 under the metal layer 62, and source/drain 68 form the transitional silicide 70. At the same time, the TiN layer 70 and un-reacted Ni and Pt are still on the transitional silicide 70. A SPM stripping process is performed, and the sulfuric acid and the hydrogen peroxide of SPM react with the TiN layer 64 and the un-reacted Ni to remove the TiN layer 64 and Ni of the metal layer 62. Subsequently, an ammonium hydrogen peroxide mixture (APM) is performed to remove the organic pollutions on the substrate 52.

Next, a surface oxidation process 72 is performed on the transitional silicide 70. In this embodiment, the surface oxidation process 72 utilizes hydrogen peroxide ($H_2O_2$) solution to spray on the surface of the transitional silicide 70. The transitional silicide 70 reacts with $H_2O_2$ solution to form oxides, such as $SiO_2$ or $SiO_x$ (not shown). These oxides form a protective layer 74 on the surface of the transitional silicide 70. Subsequently, an HPM stripping process 76 is performed. Hydrogen peroxide, chlorine, and hydrochloric acid of HPM react with the un-reacted remnant Pt on the transitional silicide 70 to form soluble complex ions, and the un-reacted Pt on the transitional silicide 70 is stripped.

To compare with the prior art, the present invention utilizes a protective layer 74 on the transitional silicide 70, so the HPM cannot react with the transitional silicide 70. By utilizing the protective layer 74, the transitional silicide 70 will not be damaged. Please note that the surface oxidation process 72 and the HPM stripping process 76 are performed circularly. The present invention does not limit the HPM stripping process 76 to be the last process, and allows the surface oxidation process 72 to be the last process.

When the un-reacted Pt on the transitional silicide 70 are removed, a second RTP is performed on the semiconductor wafer 50, and the transitional silicide reacts with the partial substrate 52 to form a more stable silicide (not shown) that has lower resistance. In this embodiment, the silicide is nickel silicide. Of course, the silicide could be cobalt silicide or titanium silicide in other embodiments. Finally, a contact etch stop layer (CESL) of the strained-silicon transistors is selectively formed, or an ILD is made by a chemical vapor deposition (CVD) and is formed on the whole substrate 52 and the gate 60. The needed contact plugs are made sequentially to complete the electrical connection of the semiconductor wafer 50.

In the present invention, the surface oxidation process 72 is performed before the HPM stripping process 76. However, in the other embodiment, the surface oxidation process 72 is performed on the transitional silicide before the SPM process. This means the oxidation protective layer 74 is formed on the transitional silicide 70 before the SPM stripping process. Otherwise, the surface oxidation process 72 is performed on the transitional silicide before the APM process. The present invention not only utilizes hydrogen peroxide in the surface oxidation process, but also utilizes ozone ($O_3$) or oxygen plasma to perform the surface oxidation process on the transitional silicide 70. When the surface oxidation process 72 utilizes hydrogen peroxide or ozone, the oxidation process and the stripping process can be performed utilizing the same equipment. If the surface oxidation process 72 utilizes oxygen plasma, however, the stripping process is performed utilizing different equipment.

Figure 7:
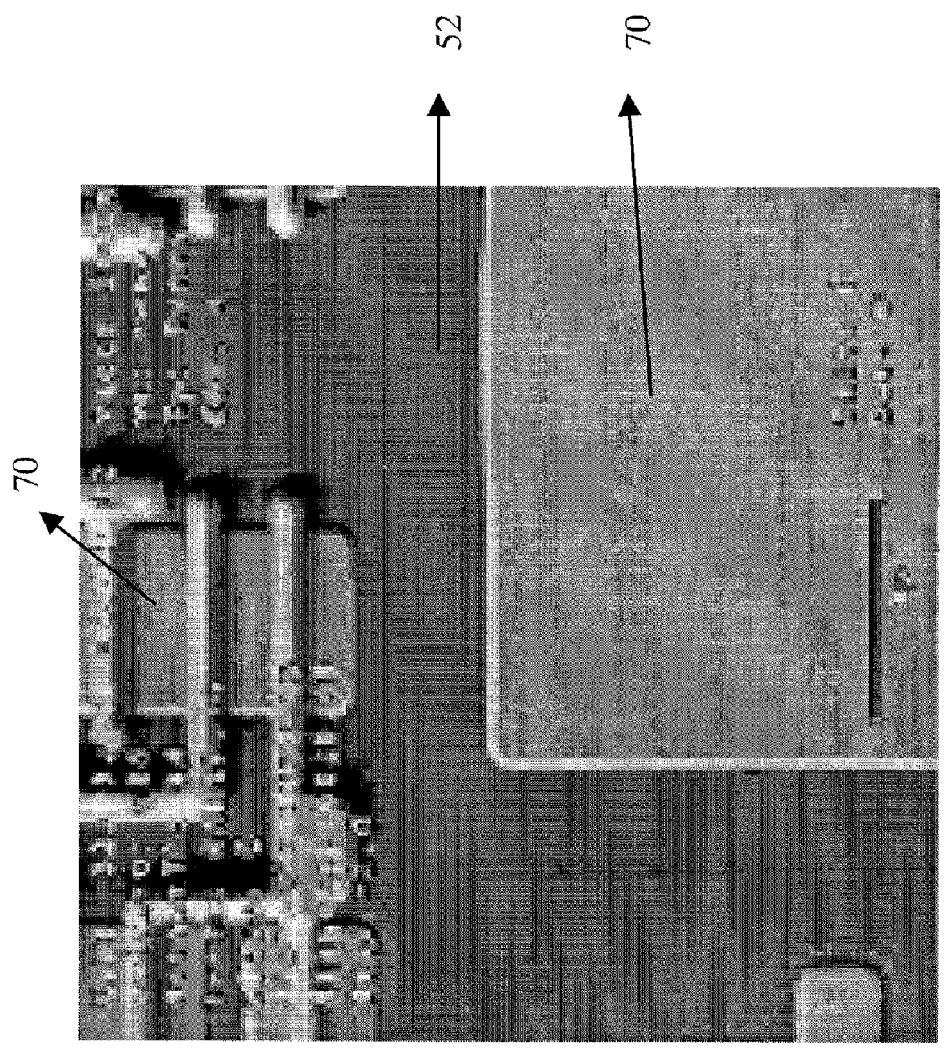
FIG. 7 is a scanning electron microscopy (SEM) diagram of the transitional silicide after the HPM stripping process.

Please refer to FIG. 7. FIG. 7 is a scanning electron microscopy (SEM) diagram of the transitional silicide after the HPM stripping process. As FIG. 7 shows, a plurality of transitional silicide 70 is on the substrate 52. The transitional silicide 70 maintains its shape and will not be damaged.

The present invention performs a surface oxidation process to form the oxidation protective layer on the transitional silicide before the stripping process is performed on the transitional silicide, so the transitional silicide will not be damaged by the stripping process. Furthermore, the surface oxidation process and the stripping process are performed circularly on the transitional silicide. The unnecessary remnants on the transitional silicide, e.g. organic particles or thermally stable metals, are stripped by the stripping process. The formed transitional silicide will not be damaged by the stripping process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a silicide, comprising:
    providing a substrate;
    forming a metal layer on the substrate, wherein the metal layer comprises a main metal and a chemically stable metal;
    forming a Ti-containing layer on the metal layer;
    performing a RTP so that at least a transitional silicide is formed on the substrate and the chemically stable metal is on the transitional silicide;
    performing a surface oxidation process consisting of hydrogen peroxide on the transitional silicide, the hydrogen peroxide reacting with the transitional silicide to form a protective layer on the transitional silicide; and
    performing a hydrochloric acid hydrogen peroxide mixture (HPM) stripping process on the substrate to strip the chemically stable metal.

2. The method of claim 1, wherein the surface oxidation process and the HPM stripping process are performed on the substrate circularly.

3. The method of claim 1, wherein the HPM stripping process is performed and then the surface oxidation process is performed.

4. The method of claim 1, wherein the chemically stable metal is from among the group comprising platinum (Pt), palladium (Pd), manganese (Mn), tantalum (Ta), ruthenium (Ru) or their composition.

5. The method of claim 1, wherein the method of forming the transitional silicide comprises:
    forming a gate on the substrate, each lateral side of the gate having a source/drain in the substrate;
    forming a metal layer on the substrate;
    forming a titanium nitride (TiN) layer on the metal layer; and
    performing a first rapid thermal process (RTP) to form the transitional silicide on the gate and the source/drain.

6. The method of claim 5, wherein a second RTP is performed after the chemically stable metal on the transitional silicide is stripped, and the transitional silicide becomes a silicide.

7. The method of claim 6, wherein the silicide is from among the group comprising nickel silicide, cobalt silicide, titanium silicide or their composition.

8. A method of forming a silicide, comprising:
    providing a substrate;
    forming a metal layer on the substrate, wherein the metal layer comprises a main metal and a chemically stable metal;
    forming a Ti-containing layer on the metal layer;
    performing a RTP so that at least a transitional silicide is formed on the substrate and the chemically stable metal is on the transitional silicide;
    performing a surface oxidation process consisting of hydrogen peroxide to form a protective layer on the transitional silicide; and
    performing a stripping process on the substrate to strip the chemically stable metal metal.

9. The method of claim 8, wherein the surface oxidation process and the stripping process are performed on the substrate circularly.

10. The method of claim 8, wherein the stripping process is performed and then the surface oxidation process is performed.

11. The method of claim 10, wherein the surface oxidation process consisting of hydrogen peroxide and the stripping process are performed in the same equipment.

12. The method of claim 8, wherein the stripping process is from among the group comprising sulfuric acid-hydrogen peroxide mixture (SPM), ammonium hydrogen peroxide mixture (APM), hydrochloric acid hydrogen peroxide mixture (HPM) or their composition, for stripping the substrate.

13. The method of claim 8, wherein the chemically stable metal is from among the group comprising platinum (Pt), palladium (Pd), manganese (Mn), tantalum (Ta), ruthenium (Ru) or their composition.

14. The method of claim 8, wherein the method of forming the transitional silicide comprises:
    forming a gate on the substrate, each lateral side of the gate having a source/drain in the substrate;
    forming a metal layer on the substrate;
    forming a titanium nitride (TiN) layer on the metal layer; and
    performing a first rapid thermal process (RTP) to form the transitional silicide on the gate and the source/drain.

15. The method of claim 14, wherein a second RTP is performed after the chemically stable metal on the transitional silicide is stripped, and the transitional silicide becomes a silicide.

* * * * *